United States Patent [19]

Mitsueda et al.

[11] 4,430,618
[45] Feb. 7, 1984

[54] INPUT BUFFER CIRCUIT

[75] Inventors: Hisami Mitsueda, Toyota; Kazuyoshi Tamaki, Nagoya; Hiromi Ariyoshi, Kariya, all of Japan

[73] Assignee: Nippondenso Co., Ltd., Kariya, Japan

[21] Appl. No.: 288,373

[22] Filed: Jul. 30, 1981

[30] Foreign Application Priority Data

Aug. 4, 1980 [JP] Japan ................................ 55-106997

[51] Int. Cl.³ ........................ H03K 5/24; H03K 17/16
[52] U.S. Cl. .................................. 328/149; 328/147; 307/359; 307/543; 307/553
[58] Field of Search ........................ 328/146, 147, 149; 307/358, 359, 553, 543

[56] References Cited

U.S. PATENT DOCUMENTS

| | | | |
|---|---|---|---|
| 4,047,056 | 9/1977 | Nakagawa | 328/147 |
| 4,088,906 | 5/1978 | Hullwegen | 307/359 |
| 4,095,126 | 6/1978 | Hoffman et al. | 307/553 |
| 4,162,454 | 7/1979 | Olsen | 328/147 |
| 4,281,317 | 7/1981 | Pace | 328/146 |
| 4,339,727 | 7/1982 | Kage et al. | 328/149 |

*Primary Examiner*—John S. Heyman
*Attorney, Agent, or Firm*—Cushman, Darby & Cushman

[57] ABSTRACT

In an input buffer circuit arrangement, a comparator compares a filtered input signal applied to one input with each of a first and a second reference value preset at the other input by a first setting circuit to produce a comparison output signal. According to the comparison output signal, a second setting circuit provides a third and a fourth reference value to one input of the comparator to obtain a noise-resistive characteristic.

2 Claims, 4 Drawing Figures

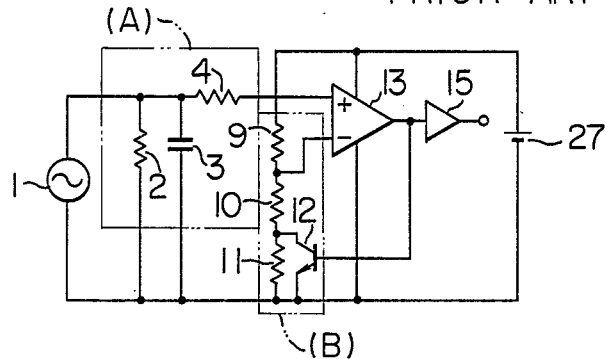
FIG. 1 PRIOR ART
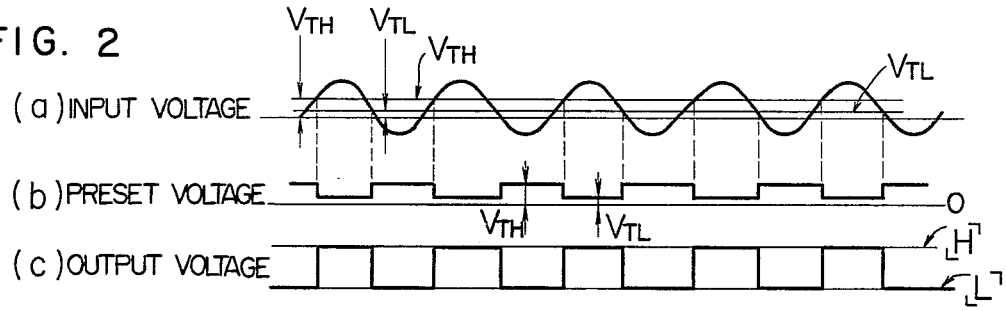
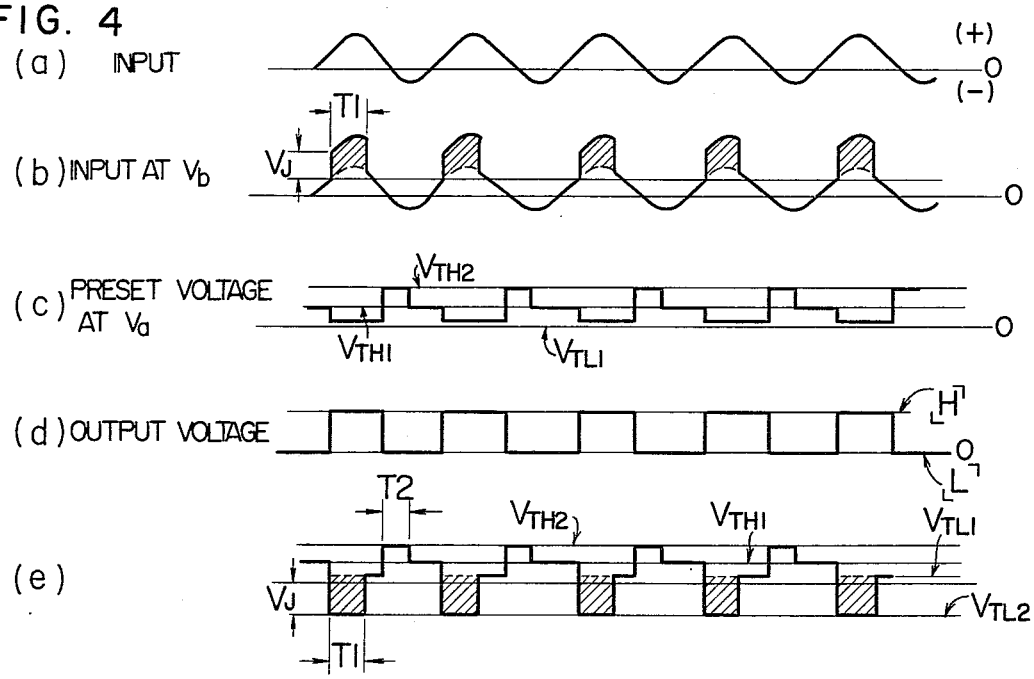

INPUT BUFFER CIRCUIT

BACKGROUND OF THE INVENTION

The present invention relates to an input buffer circuit for detecting the frequency or angular information of an electromagnetic pickup coil in terms of a voltage.

In a known input buffer circuit of the above type, the voltage signal from a pickup coil is reshaped through a CR filter and then subjected to voltage comparison by a comparator. The CR filter circuit is an essential circuit element for the purpose of eliminating any noise signal superposed on the signal line of the pickup coil. However, where the time constant of the CR filter circuit is increased, if the signal frequency is high, the signal voltage from the pickup coil will be delayed in phase, thus making it impossible to obtain an accurate angular information. In other words, there is a disadvantage that if the time constant of the noise suppressing CR filter circuit is increased so as to improve the antinoise characteristic, the resulting angular information and detection response characteristic will be deteriorated.

SUMMARY OF THE INVENTION

With a view to overcoming the foregoing deficiencies of the prior art circuit, it is the object of the present invention to provide an improved input buffer circuit so designed that when the first and second threshold levels of a comparator are respectively crossed from predetermined directions by the input signal, the threshold levels are respectively set again to new third and fourth threshold levels, respectively, for a predetermined period thus improving the antinoise and response characteristics.

BRIEF DESCRIPTION OF THE DRAWINGS

FIG. 1 is a circuit diagram showing a prior art input buffer circuit.

FIG. 2 shows various waveforms useful for explaining the operation of the prior art input buffer circuit.

FIG. 4 shows various waveforms useful for explaining the operation of the circuit according to the present invention.

DESCRIPTION OF THE PREFERRED EMBODIMENT

Figure 3:
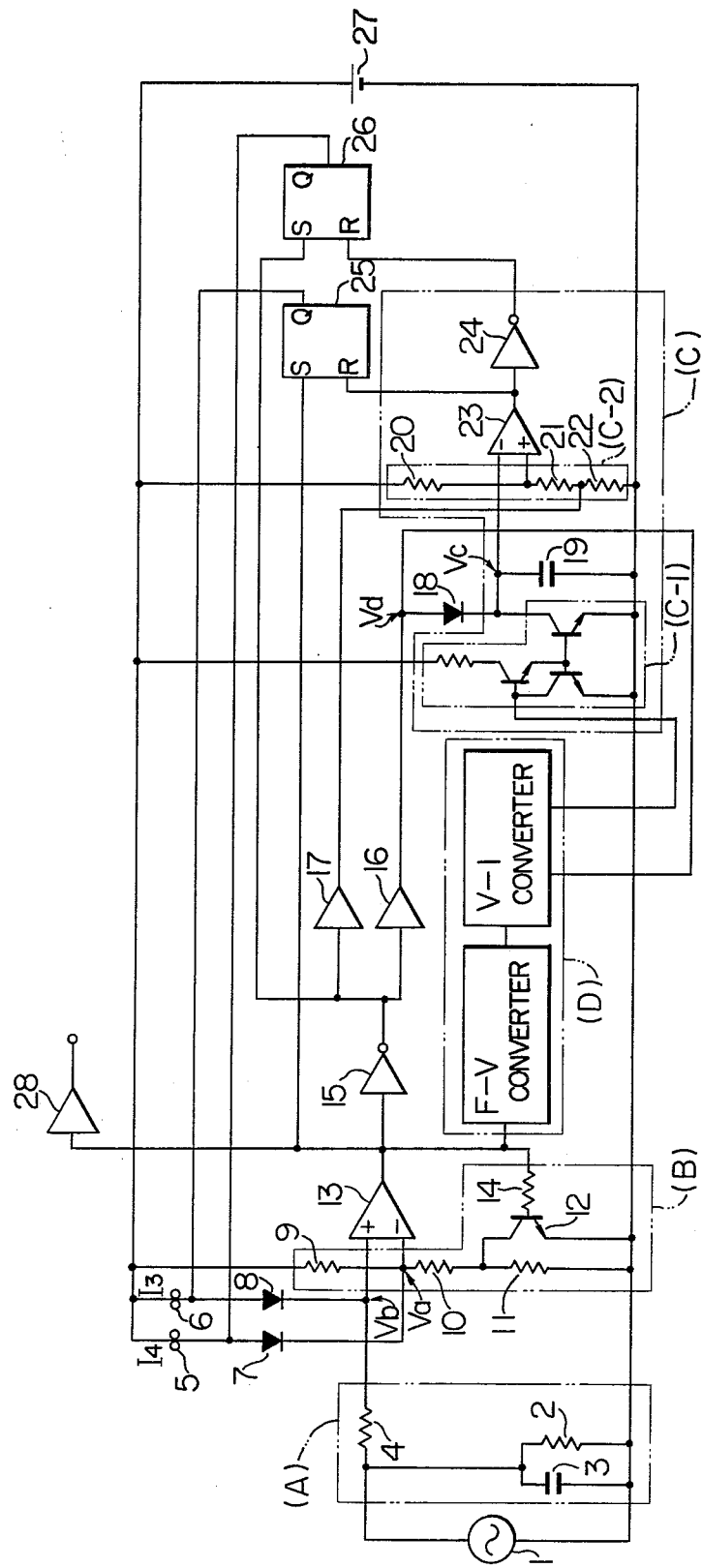
FIG. 3 is a circuit diagram showing an input buffer circuit according to the present invention.

The present invention will now be described with reference to the accompanying drawings. FIG. 1 illustrates a circuit diagram of a prior art input buffer circuit. FIG. 2 illustrates various waveforms useful for explaining the operation of the prior art circuit. In the Figures, numeral 1 designates an input signal source. Symbol A designates a filter circuit comprising a resistor 2, a capacitor 3 and a resistor 4. Symbol B designates a setting circuit for establishing a first preset voltage $V_{TH1}$ and a second preset voltage $V_{TL1}$ and the circuit comprises resistors 9, 10 and 11 and a transistor 12. Numeral 13 designates an input signal detecting comparator whose (+) terminal is supplied with the input signal via the filter circuit and whose (−) terminal is supplied with the first and second preset voltages $V_{TH1}$ and $V_{TL1}$ set by the setting circuit. Numeral 15 designates an output amplifier, and 27 a power source.

FIG. 3 is a circuit diagram showing an input buffer circuit according to the present invention. The same reference numerals as used in FIG. 1 designate the identical component parts. Numerals 5 and 6 designate constant current sources for respectively supplying fourth and third preset voltages $V_{TH2}$ and $V_{TL2}$ to the comparator 13 via diodes 7 and 8, respectively. Numeral 14 designates the base resistor of the transistor 12. Symbol C designates a time setting circuit for determining a holding time of the third and fourth preset voltages $V_{TL2}$ and $V_{TH2}$. Symbol C-1 designates a current mirror circuit operable in synchronism with the input signal so as to control the charge and discharge times of a capacitor 19 in accordance with the amount of output current of a frequency-to-current converter circuit D. Symbol C-2 designates a voltage setting circuit for a comparator 23 for detecting the voltage on the capacitor 19 and the circuit comprises resistors 20, 21 and 22. Numeral 24 designates an output amplifier for the comparator 23. The frequency-to-current converter circuit D comprises a frequency-to-voltage converter and a voltage-to-current converter. The comparison output of the comparator 13 is applied to the current mirror circuit C-1 via an amplifier 16 and a diode 18 and to the voltage setting circuit C-2 via an amplifier 17. Numerals 25 and 26 designate flip-flops adapted to be set by the output of the comparator 13 and reset by the output of the comparator 23. Numeral 28 designates an output amplifier for the comparator 13.

Next, the operation of the buffer circuit according to the present invention will be described with reference to FIGS. 3 and 4. The signal generating voltage $V_{in}$ of the signal source 1 is compared and detected by the comparator 13 via the filter circuit A and the operating preset voltage at a point $V_a$ of the comparator 13 (hereinafter referred to as a threshold voltage $V_{TH}$) is determined by the $V_{TH1}/V_{TL1}$ setting circuit B. In this case, if the voltage of the input signal $V_{in}$ is a positive-going voltage signal exceeding the first preset voltage $V_{TH1}$, the output of the comparator 13 goes to a high level or "H" and the output of the buffer circuit also goes to "H". Simultaneously, the transistor 12 is turned on and the preset voltage at the point $V_a$ is changed to the second preset voltage $V_{TL1}$. On the other hand, the "H" output of the comparator 13 sets the flip-flop 25 (hereinafter referred to as an FF1) and the output of the FF1 causes a constant current $I_3$ to flow from the constant current source 6 toward a point $V_b$. As a result, the voltage at the point $V_b$ becomes $V_{in}+\{\text{resistor } 4 \times I_3\}$ (here it is referred to as the resistor $4 \times I_3 = V_{JAMP} = V_J$). The holding time $T_1$ of the voltage $V_J$ is determined by the frequency-to-current converter circuit or F-1 converter circuit D whose output current varies with the input frequency and the FF1 setting circuit C. In other words, the holding time $T_1$ is set such that lower the input frequency is, longer the time $T_1$ becomes, while higher the input frequency is, shorter the time $T_1$ becomes. The voltage waveform of the input $V_{in}$ is shown in (a) of FIG. 4 and the voltage waveform at the point $V_b$ is shown in (b) of FIG. 4. When the voltage $V_{in}$ decreases from its positive value toward a negative value so that it becomes lower than the second preset voltage $V_{TL1}$, the output voltage of the comparator 13 goes to a low level or "L". Consequently, the output of the buffer circuit also goes to "L". Simultaneously, the transistor 12 is turned off so that not only the voltage at the point $V_a$ is set to $V_{TH1}$ but also the flip-flop 26 or FF2 is set, thus causing a constant current $I_4$ to flow from the constant current source 5 toward the point $V_a$. As a result, the voltage at the point $V_a$ becomes $V_{TH1}$+{resistor 10+resistor 11}. $I_4=V_{TH2}$. This condition is shown in (c) of FIG. 4. Its holding time $T_2$ is also made dependent on the input frequency by the F-1 converter circuit D and the FF2 setting circuit C as in the case of the holding time $T_1$. Thus, when the FF2 is reset, the preset voltage is returned to $V_{TH1}$ and the circuit is placed in condition for the next input signal.

The relationship between the input voltage and the preset voltage in dependence on the relationship among the $V_{TH1}$, $V_{TH2}$, $V_{TL1}$ and $V_J$ is shown in (e) of FIG. 4. The $V_{TH1}$, $V_{TL1}$ and $V_{TH2}$ show the preset voltages or the actual voltages at the point $V_a$ in FIG. 3. The voltage $V_{TL2}$ shows a condition which is the same as if the preset voltage $V_{TL1}$ at the point $V_a$ is apparently decreased by the amount of $V_J$ due to the application of the superposing voltage $V_J$ on the input voltage $V_{in}$.

By virtue of the construction described above, when the comparator operates in response to the first and second preset voltages $V_{TH1}$ and $V_{TL1}$, respectively, they are immediately set again to the third and fourth preset voltages $V_{TL2}$ and $V_{TH2}$, respectively, for a period of time corresponding to the input frequency, thus preventing any erroneous on-off operation during a transitional period due to an external noise. Also, since the re-setting time $T_s$ is selected smaller than the input period T, |Vin| is smaller than $V_{TL2}$ and $V_{TH2}$. Even if any input voltage irregularity occurs, there is a certain time domain in which the comparator is operated and consequently the occurrence of any fatal erroneous operation is prevented. Thus, the input buffer circuit of this invention has an increased response speed and an improved antinoise characteristic.

We claim:
1. An input buffer circuit comprising:
   a filter circuit for eliminating noise included in a signal from a signal source;
   a voltage setting circuit for establishing a first and a second predetermined voltage;
   a comparator circuit for comparing an output signal of said filter circuit with each of said predetermined voltages to generate a comparison output signal;
   flip-flop circuit means responsive to said comparison output signal of said comparator circuit to generate a gate signal;
   constant current circuit means responsive to said gate signal to selectively supply a third and a fourth predetermined voltage to said comparator circuit;
   frequency-to-current converter means for converting said comparison output signal to a current signal corresponding to the frequency thereof; and
   time setting circuit means responsive to said current signal to determine a holding time of said third and fourth predetermined voltages, respectively.

2. An input buffer circuit arrangement for detecting a voltage signal of electromagnetic pickup coil including a filter circuit for filtering noise components of an input signal applied thereto, first setting circuit for establishing a first and a second reference value, and a first comparator circuit for comparing the filtered output signal applied to a non-inverting terminal thereof with each of said reference values applied to an inverting terminal thereof, the improvement comprising:
   a first flip flop circuit responsive to the output signal of said first comparator circuit to provide a third reference signal to the non-inverting terminal of said first comparator circuit;
   a second flip flop circuit responsive to the inverted output signal of said first comparator circuit to provide a fourth reference signal to the inverting terminal of said first comparator circuit;
   a frequency-voltage converter responsive to the output of said first comparator to provide a voltage signal proportional to the frequency of output of said first comparator circuit;
   a voltage-current converter responsive to said frequency-voltage converter to provide a current signal proportional to the output voltage of said frequency-voltage converter;
   a current mirror circuit responsive to said voltage-current converter to provide a time setting signal; and
   a second comparator circuit responsive to said current mirror circuit to provide a reset signal to said first and second flip flop circuits, respectively.

* * * * *